(12) United States Patent
Lee (10) Patent No.: US 9,450,125 B2
(45) Date of Patent: Sep. 20, 2016

(54) STRETCHABLE SUBSTRATE, STRETCHABLE PHOTOVOLTAIC APPARATUS, AND STRETCHABLE DEVICE

(71) Applicant: GWANGJU INSTITUTE OF SCIENCE AND TECHNOLOGY, Buk-gu, Gwangju (KR)

(72) Inventor: Jongho Lee, Gwangju (KR)

(73) Assignee: GWANGJU INSTITUTE OF SCIENCE AND TECHNOLOGY, Buk-Gu, Gwangju (KR)

( * ) Notice: Subject to any disclaimer, the term of this patent is extended or adjusted under 35 U.S.C. 154(b) by 383 days.

(21) Appl. No.: 13/852,528

(22) Filed: Mar. 28, 2013

(65) Prior Publication Data

US 2014/0144480 A1    May 29, 2014

(30) Foreign Application Priority Data

Nov. 29, 2012    (KR) .................. 10-2012-0136659

(51) Int. Cl.
| | |
|---|---|
| *H01L 31/048* | (2014.01) |
| *H01L 31/042* | (2014.01) |
| *H01L 31/05* | (2014.01) |
| *H01L 31/0687* | (2012.01) |
| *H01L 31/0475* | (2014.01) |

(52) U.S. Cl.
CPC ......... *H01L 31/0422* (2013.01); *H01L 31/048* (2013.01); *H01L 31/0475* (2014.12); *H01L 31/0504* (2013.01); *H01L 31/0687* (2013.01); *Y02E 10/544* (2013.01); *Y10T 428/24479* (2015.01)

(58) Field of Classification Search
CPC .......... H01L 31/0422; H01L 31/0504; H05K 1/0283
USPC ........................................... 361/749; 136/244
See application file for complete search history.

(56) References Cited

U.S. PATENT DOCUMENTS 5,385,848 A * 1/1995 Grimmer ........................ 438/62
6,116,309 A * 9/2000 Gillard et al. ............ 152/209.14

OTHER PUBLICATIONS

Lee, J. et al., "Stretchable Semiconductor technologies with High Areal Coverages and Strain-Limiting Behavior: Demonstration in High-Efficiency Dual-Junction GaInP/GaAs Photovoltaivs" Small, vol. 8 Issue 12, pp. 1851-1856, (2012).

* cited by examiner

*Primary Examiner* — Matthew Martin
*Assistant Examiner* — Tae-Sik Kang
(74) *Attorney, Agent, or Firm* — Nath, Goldberg & Meyer; Jerald L. Meyer; Christopher Thomas (57) ABSTRACT

A stretchable photovoltaic apparatus according to the present invention includes: a stretchable substrate including islands protruded from a base such that the islands are separated by a trench, and a notch formed in an edge of each of the islands; a photovoltaic cell mounted on the stretchable substrate; and an interconnector of which at least a portion is positioned inside the notch, the interconnector electrically connecting the neighboring photovoltaic cells in one pair. According to the present invention, a semiconductor device may be configured in the form of a stretchable array. Therefore, the present invention is expected to be applied to various industrial fields such as a solar cell field, a display field, a semiconductor device field, a medical field, a clothing field, a measurement field, and a filming field.

14 Claims, 9 Drawing Sheets

STRETCHABLE SUBSTRATE, STRETCHABLE PHOTOVOLTAIC APPARATUS, AND STRETCHABLE DEVICE

CROSS-REFERENCE TO RELATED APPLICATION

This application claims priority to Korean Patent Application No. 10-2012-0136659 filed on 29 Nov. 2012 and all the benefits accruing therefrom under 35 U.S.C. §119, the contents of which are incorporated by reference in their entirety.

BACKGROUND

The present invention disclosed herein relates to a stretchable substrate, a stretchable photovoltaic apparatus, and a stretchable device. More particularly, the present invention relates to a technology of realizing a stretchable micro device array.

In recent years, there has been introduced a method of manufacturing an array system of electronic/photonic micro devices formed of an inorganic material having a stretchable property as well as a flexible property. Such an inorganic material includes materials such as single crystalline silicon and gallium arsenide. Meanwhile, in such devices and circuits, characteristics on the electric performance and reliability have been well established as a result of decades of study.

The existing flexible technologies or stretchable technologies have been focused on a hetero junction of an inorganic material and an organic material that have different elastic constants from each other so as to overcome a design limitation due to a platform which uses a traditional semiconductor element, for example, a semiconductor substrate having a planar shape, and hard and brittle properties.

A mechanical structure that isolates and protects a brittle inorganic material from a strain associated with a deformation occurring in other parts of the system is very important. This mechanical structure includes a specific means. The means may be exemplified by a structure that converts an out-of-plane of a mechanically buckled structure to a relative behavior such that the device is in-plane. An advanced approach based on such an idea has been introduced in non-patent document 1 suggested as a cited reference.

In the non-patent document 1, a study object is a mechanically structured substrate. In brief, a micro device is disposed on a protruded island. An interconnector interconnecting neighboring micro devices is curved and enters a trench isolating the islands from each other. By doing so, an upper surface of the island is not almost deformed and a boundary stress delivered to the micro device mounted on the upper surface of the island is minimized. Another advantage of the system introduced in the non-patent document 1 is an ability that may have a wide areal coverage where active devices performing a role such as photosensing or solar cell generation are placed in the entire two-dimensional range of the substrate.

By the non-patent document 1, effects that a stretchable characteristic for a micro device array is obtained and the areal coverage is increased may be obtained. However, when a strain corresponding to an extreme deformation condition is applied, the micro device array may be fractured. This is a cause shortening the life span of the stretchable device, and has a fatal influence on the reliability of the stretchable products that have to endure a continuous deformation behavior.

PRIOR ART DOCUMENTS

Non-Patent Documents

Non-patent document 1: Jongho Lee, Jian Wu, Mingxing Shi, Jongseung Yoon, Sang-Il Park, Ming Li, Zhuangjian Liu, Yonggang Huang and John A. Rogers, "Stretchable GaAs Photovoltaics with Designs That Enable High Areal Coverage", Advanced Materials, 23, 986, 2011.

SUMMARY

The present invention provides a technology that may stabilize a stretchable behavior of a stretchable substrate caused by the characteristics of the stretchable substrate within a restrictive strain range.

The present invention also provides that may guarantee stable settlement of micro devices.

The present invention also provides a technology that may secure a stable operation to enhance the reliability and life span of a stretchable product.

The present invention also provides a technology that may further enhance the stretchable characteristic of a stretchable substrate.

The present invention also provides a technology that secures the adaptive property to various mechanical designs to allow a thick and brittle semiconductor device to be realized in a stretchable array.

In accordance with an aspect of the present invention, a stretchable photovoltaic apparatus includes: a stretchable substrate including islands protruded from a base such that the islands are separated by a trench, and a notch formed in an edge of each of the islands; a photovoltaic cell mounted on the stretchable substrate; and an interconnector of which at least a portion is positioned inside the notch, the interconnector electrically connecting the neighboring photovoltaic cells in one pair.

The island may have at least any one shape of a triangle, a rectangle, a polygon, a circle, and an ellipse, the notch may have at least any one shape of a triangle, a rectangle, a polygon, a circle, and an ellipse, and the notch may be provided to a center of each of the edges of the island.

The interconnector may be placed inside the notch when the stretchable substrate is deformed and thus the islands in one pair contact each other, the notch may be provided to the edges in one pair facing each other when the island has a rectangular shape, and the notch may be provided to all the edges.

Also, the photovoltaic cell may be a dual junction GaInP/GaAs, a single junction GaAs, a triple junction GaInP/GaAs/Ge, an organic solar cell, a thin film solar cell, or a silicon solar cell, the notch may extend from an upper side of the island to an upper side of the base, and the photovoltaic cell may have a notch having a similar shape to the notch.

In accordance with another aspect of the present invention, a stretchable substrate includes: a base; islands protruded from the base and spaced apart by a trench from each other; and a notch provided to an edge of each of the islands. The island or the notch may have at least any one shape of a triangle, a rectangle, a polygon, a circle, and an ellipse, when the island is a polygon, the notch may be provided to each of the edges of the islands or the edges in one pair facing each other, and the notch may extend downward from an upper side of the island to the base.

In accordance with another aspect of the present invention, there is provided a stretchable device includes: a stretchable substrate having at least two islands; a micro device mounted on each of the islands; an interconnector electrically or mechanically connecting the micro devices; and a stretchable material provided on at least any of a lower side of the stretchable substrate and an upper side of the micro device. The stretchable device may include a notch which is provided to the edge of the island such that at least a portion of the interconnector is placed, the stretchable material may be a cloth, and the stretchable device may include a protection coating further provided between the micro device and an upper side of the micro device.

In accordance with another aspect of the present invention, a stretchable device includes: a stretchable substrate having at least two islands; a micro device mounted on each of the islands; a notch provided to an inside of an edge of each of the islands; and an interconnector connecting the micro devices. At least a portion of the interconnector may be placed inside the notch in a state that the stretchable substrate is relaxed, and at least a portion of the interconnector may be placed inside the notch in a state that the stretchable substrate is deformed to a maximum degree.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described with reference to the accompanying drawings. However, the following embodiment is only a form obtained under the spirit of the present invention, a person skilled in the art would easily suggest another embodiment included in the scope of the same spirit by adding, modifying, and deleting an element, and such addition, modification and deletion will be included in the spirit of the present invention.

<Stretchable Substrate>

Figure 1:
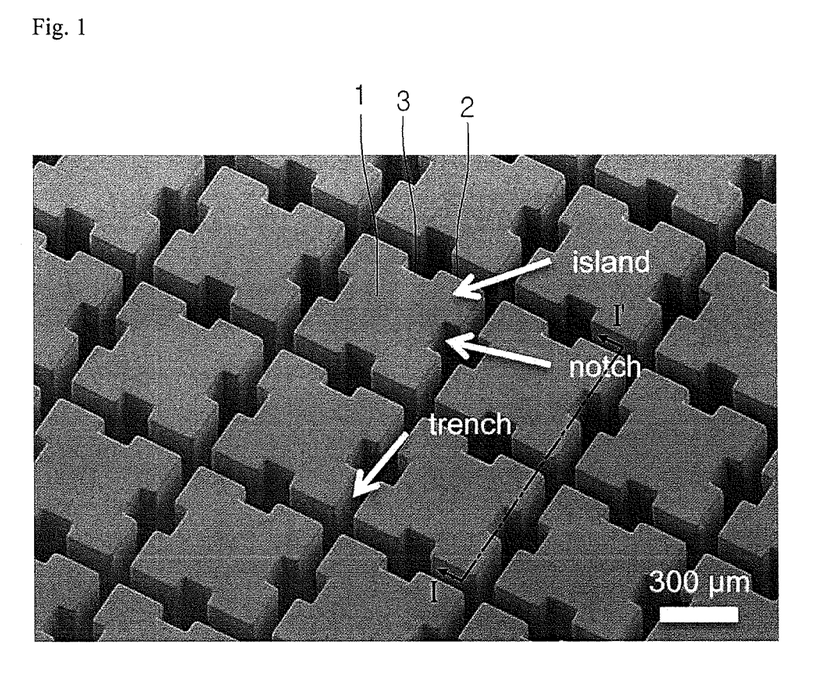
FIG. 1 is a partial perspective view of a stretchable substrate according to an embodiment.

FIG. 1 is a partial perspective view of a stretchable substrate according to an embodiment.

Figure 2:
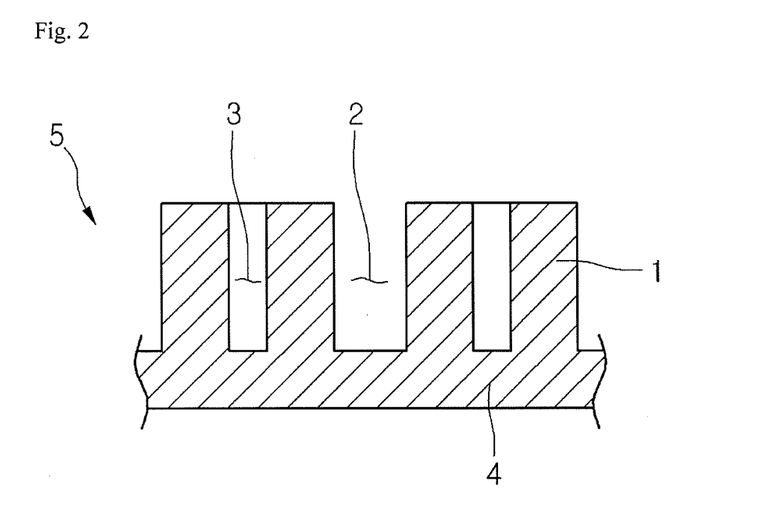
FIG. 2 is a cross-section view taken along the line I-I' of FIG. 1.

Referring to FIG. 1, a stretchable substrate 5 that may be formed of elastomer is provided. The stretchable substrate 5 includes islands 1 each having four edges and rectangular notches 3 formed along each edge, and having a shape protruded upward. The neighboring islands 1 in one pair are isolated from each other by a trench 2. FIG. 2 is a cross-section view taken along the line I-I' of FIG. 1. Referring to FIG. 2, it may be seen that the islands 1 of the stretchable substrate 5 are connected by a base 4. The stretchable substrate 5 isolates a strain such that the strain is not delivered to an upper surface of each of the islands 1. By doing so, the stretchable substrate may provide an area where an array configured by interconnecting micro-scale micro devices (e.g., a micro-scale device such as a photovoltaic cell, a light emitting device, or the like) to be mounted on the islands 1 is mounted.

The island and the notch may have a polygonal shape such as a triangle, a pentagon, or the like, a circular shape, or an elliptical shape. However, the present embodiment shows an example of the rectangle.

The notch may function as a portion to provide a space where an interconnector 7 is disposed, and one, two, three or more notches every edge may be provided. When the island 1 has a rectangular shape, the notch may be formed in each of edges in one pair facing each other or in each of four edges. In the present embodiment, each island has total four notches, one at a middle portion of each of the four edges.

The stretchable substrate may be formed of poly(dimethylsiloxane) (PDMS) or Ecoflex. However, the present invention is not limited thereto, and any substrate may be used if it has the stretchable characteristic.

The PDMS substrate may be formed by a soft lithography molding of a corresponding original substrate defined by a photolithography. In the embodiment, side surface of the neighboring islands 1 are separated by the trench 2 having a width of 76 micrometers, and each of the islands 1 has a size of 500×500 µm2. The notch 3 provided to the island 1 has a width of 120 micrometers and a depth of 60 micrometers. The island 1 has a height of 350 micrometers and the base 4 has a thickness of 160 micrometers. According to the numerical values, the area where the micro devices are mounted is about 67% of the entire area of the stretchable substrate.

In the islands in one pair facing each other, a distance between the inner edges of the notches 3 in one pair is about 196 micrometers. That is, the distance is equal to 60+76+60 micrometers which correspond to a sum of two depths of the notches in one pair and the width of the trench. In a case that is free of the notches, a distance between the neighboring edges of the neighboring islands 1 in one pair is about 76 micrometers. That is, the case of having the notches is greater by the depths of the notches in one pair than the case of not having the notches.

Compared with the case having the rectangular islands each being free of any notch, this feature increases the entire length of the interconnector 7, which plays a role as an electrical and mechanical connecting line for the neighboring micro devices and passes along the trenches. The increase in length of the interconnector 7 is expected to decrease a strain occurring in the interconnector 7 when the stretchable substrate 5 is deformed. In other words, an effect that the longer the interconnector in the same deformation, the less the stress to which the interconnector is subject may be expected. Therefore, worry about fracture of the interconnector may decrease, and reliability of the entire micro device array may be enhanced.

Figure 3:
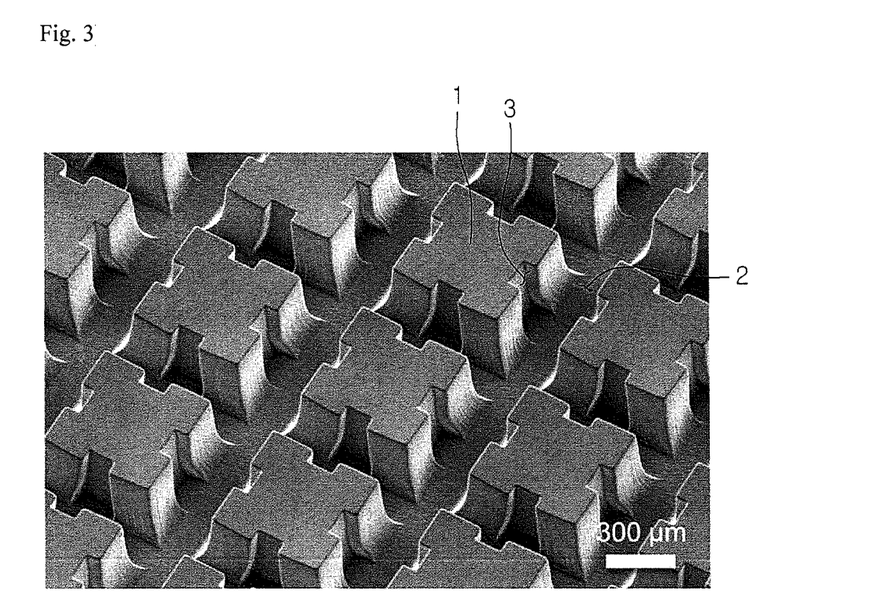
FIG. 3 is a partial perspective view of a substrate deformed when a total 37% of strain is applied in both directions of horizontal direction and vertical direction.

FIG. 3 is a partial perspective view of a substrate deformed (e.g., stretched) when a total 37% of strain is applied in both directions of horizontal direction and vertical direction.

Referring to FIG. 3, since the trench 2 provides a section in the thickness of the substrate, i.e., the thickness of the base 4 alone, although the entire stretchable substrate 5 is deformed, it is possible to localize the strain to the trench 2. Also, the strain in the island 1 gradually decreases as it goes from a lower side of the island 1 to an upper side of the island 1. By doing so, the strain in the regions supporting the micro devices may be minimized.

Meanwhile, it may be seen that the stretchable substrate having the notches in micro unit according to the embodiment has almost three times greater stretchability than a resultant substrate having the same area range disclosed in non-patent document 1. That is, the stretchable characteristic in the stretchable substrate according to the embodiment is expected to be enhanced. This effect will be described with reference to FIG. 4.

Figure 4:
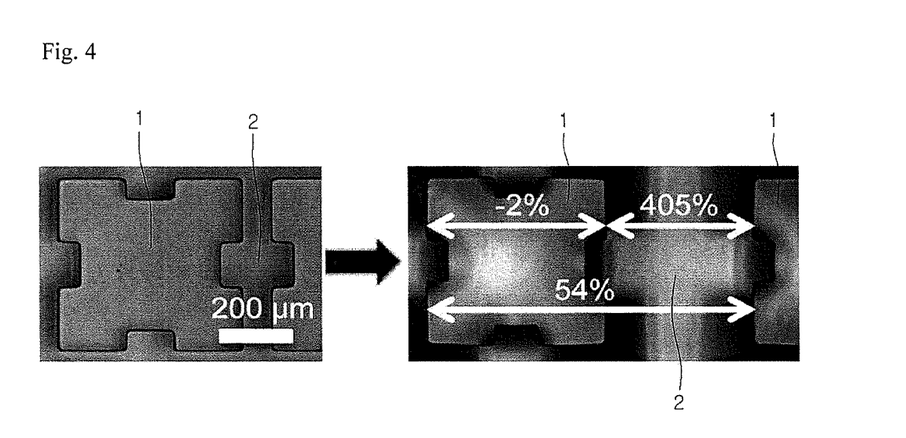
FIG. 4 shows a stretchable substrate which has been subject to a 54% of tensile strain.

FIG. 4 shows SEM images of a stretchable substrate which has been subject to a 54% of tensile strain, in which the left image is a SEM image before a tensile force is applied and the right image is a SEM image after a tensile force is applied. Referring to FIG. 4, the extension (about −2%) in the island 1 is about 200 times greater than that in the trench 2. The inventor determines that the strain having a small negative value in the island 1 may be decreased to zero (0) by properly selecting the height of the island.

The notch 3 provides a feature that allows the interconnector to be stably positioned. Concretely, while the stretchable substrate 5 is deformed and thus upper surfaces of the neighboring islands contact each other, the notch 3 may provide a spacing for the interconnector 7. In other words, while the deformation or strain applied to the stretchable substrate 5 goes to extremes and thus edges of the neighboring islands 5 in one pair contact each other, the inner side surfaces of the corresponding notches 3 do not contact each other. Therefore, the interconnector 7 may be stably positioned in the inner space formed by the notches 3 in one pair facing each other. Compared with the structure free of notch, this strain-limiting behavior allows a damage that may occur in the interconnector to be avoided.

Figure 5:
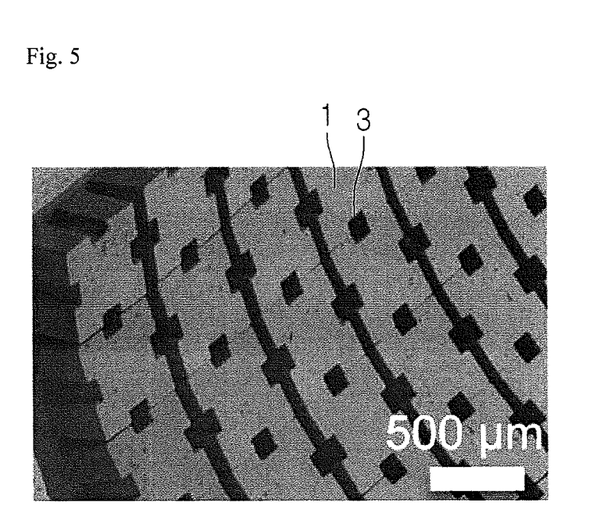
FIG. 5 is a SEM photograph showing bending of a stretchable substrate enclosed by a cylinder having a radius of 3.6 mm.

FIG. 5 is a SEM photograph showing bending of a stretchable substrate enclosed by a cylinder having a radius of 3.6 mm. Referring to the SEM image of FIG. 5, it is clearly seen that the outer edges of the islands 1 almost contact each other but the inner edges of the notches 3 do not contact each other. By doing so, a space for the interconnector 7 may be secured.

In particular, while the width of the trench 2 decreases to a very small value of 22 micrometers, the side space for the interconnector 7 is still relatively wide and is about 142 micrometers. Therefore, although a severe strain is applied, the interconnector 7 may be prevented from being fractured.

Figure 6:
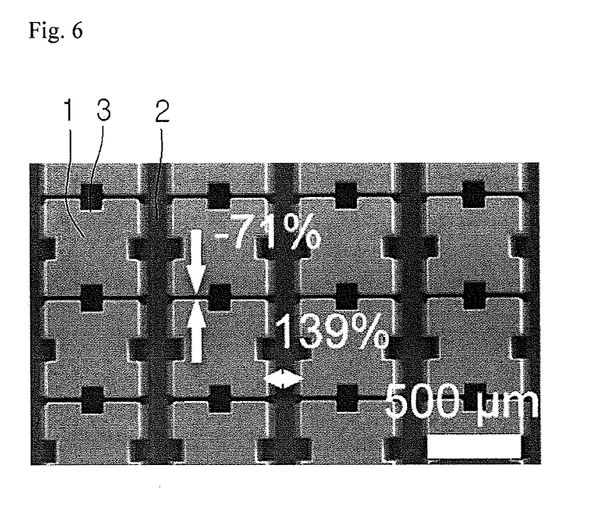
FIG. 6 is a SEM photograph of a stretchable substrate when a 18% of strain is applied in one axis direction.

FIG. 6 is a SEM photograph of a stretchable substrate when an 18% of strain is applied in one axis direction. Referring to FIG. 6, the trench 2 extends by 139% in the stretched direction, and is contracted by 71% in a direction perpendicular to the stretched direction due to Poisson's effect.

Figure 7:
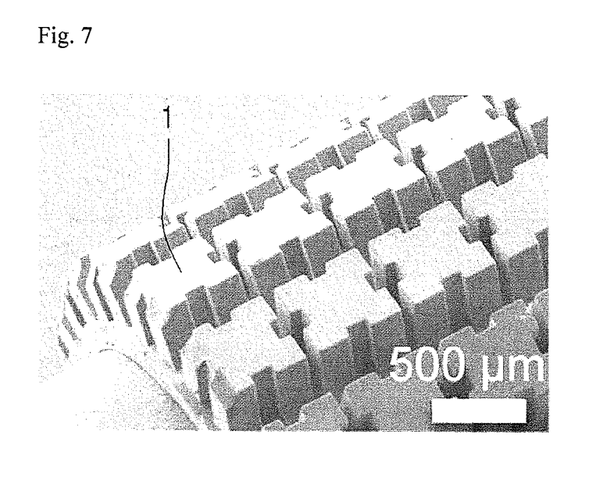
FIG. 7 is a SEM image showing that a stretchable substrate wound on a cylinder having a radius of 1.5 mm is bent outward.

FIG. 7 is a SEM image showing that a stretchable substrate wound on a cylinder having a radius of 1.5 mm is bent outward. Referring to FIG. 7, the base 4 of the stretchable substrate 5 and the bottom region of the island 1 absorb a bending stress. On the other hand, the upper surface of the island 1 maintains a flat state due to a minimum strain.

Figure 8:
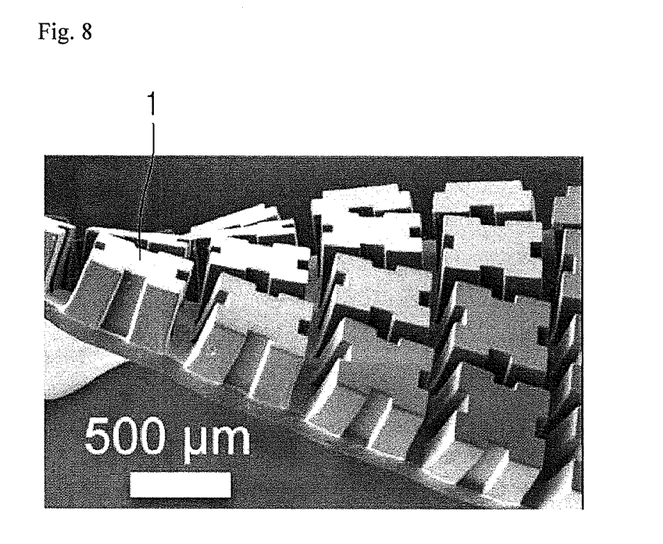
FIG. 8 is a SEM image showing that a stretchable substrate is distorted by 60 degrees in a length of 3.46 mm.

FIG. 8 is a SEM image showing that a stretchable substrate is distorted by 60 degrees in a length of 3.46 mm. It is seen that the upper surfaces of the islands 1 are subject to only a minimum strain.

<Stretchable Photovoltaic Apparatus>

It has been confirmed above that the stretchable substrate capable of substantially realizing the stretchable function may be provided. The inventor performed experiments in which the stretchable substrate was employed as a supporter for a photovoltaic apparatus. A micro device array in which dual junction GaInP/GaAs photovoltaic cells having a total thickness of about 6.14 micrometers are mounted and arranged on islands as micro devices was used. The photovoltaic cell is not limited to the dual junction GaInP/GaAs, and a single junction GaAs, a triple junction GaInP/GaAs/Ge, and solar cells such as an organic solar cell, a thin film solar cell, and a silicon solar cell may be used. However, in the following embodiment, description is made by exemplifying a dual junction GaInP/GaAs.

The manufacturing process will be described. First, an epitaxial layer grown on a GaAs wafer is processed to form micro cells each having a predetermined dimension (size: 460 μm×460 μm, notch: 160 μm×160 μm). The GaAs wafer is then etched such that an n-contact and a p-contact are exposed. The micro cells are separated by removing an underlying sacrificial layer from the epitaxial stack.

The micro cell array is transferred and printed on a plastic substrate, and a preparation for providing an electrical/mechanical interconnector in a mesh structure is performed. The method for providing the interconnector may be understood through the previous study of the inventor et al., ⌜Jongho Lee, Jian Wu, Mingxing Shi, Jongseung Yoon, Sang-Il Park, Ming Li, Zhuangjian Liu, Yonggang Huang,* and John A. Rogers "Stretchable GaAs Photovoltaics with Designs That Enable High Areal Coverage" advanced materials 2011.23 986-991⌟, the entire of which is incorporated in the description of the present invention.

A mesh structure opened as a resultant structure is transferred on the stretchable substrate that is deformed in advance by transferring and printing the interconnector in an alignment state. The previously applied stress is relaxed to complete the process. Thereafter, a protection coating may be further formed. The transferring and printing process and the protection coating process may be understood through the previous study of the inventor et al., ⌜Jongho Lee, Jian Wu, Mingxing Shi, Jongseung Yoon, Sang-Il Park, Ming Li, Zhuangjian Liu, Yonggang Huang and John A. Rogers "Stretchable GaAs Photovoltaics with Designs That Enable High Areal Coverage" advanced materials 23 9862011., the entire of which is incorporated in the description of the present invention.

Figure 9:
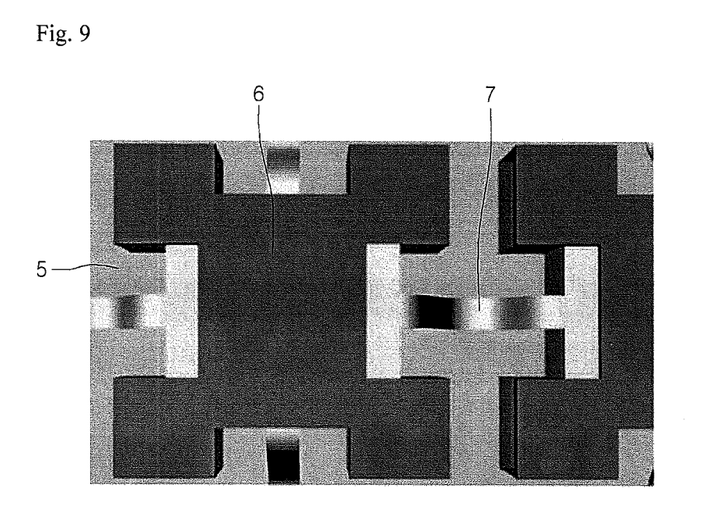
FIG. 9 is a plan view of a photovoltaic apparatus manufactured according to an embodiment.
Figure 10:
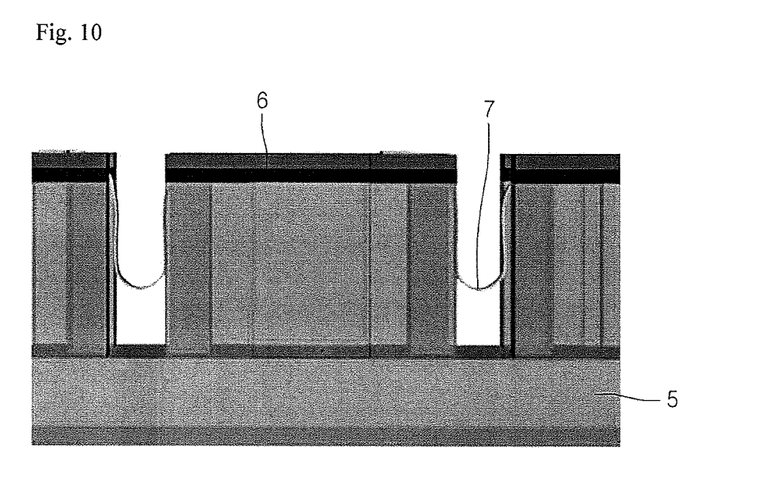
FIG. 10 is a side view of the stretchable photovoltaic apparatus.
Figure 11:
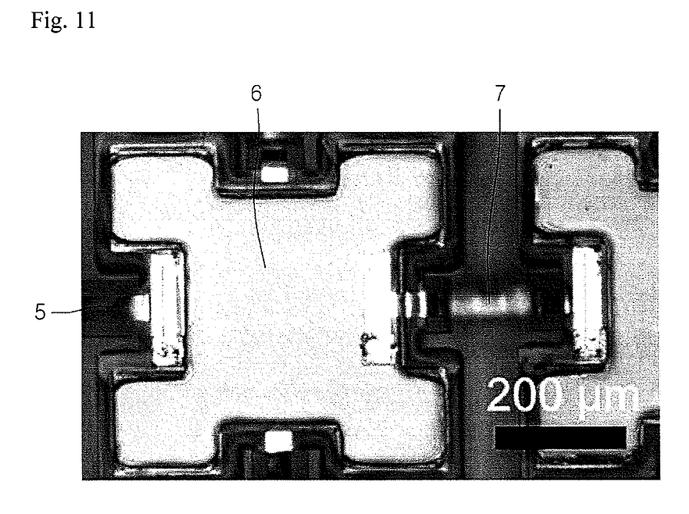
FIGS. 11 and 12 are plan and side microscopic images of a stretchable photovoltaic apparatus completed as a real product.
Figure 12:
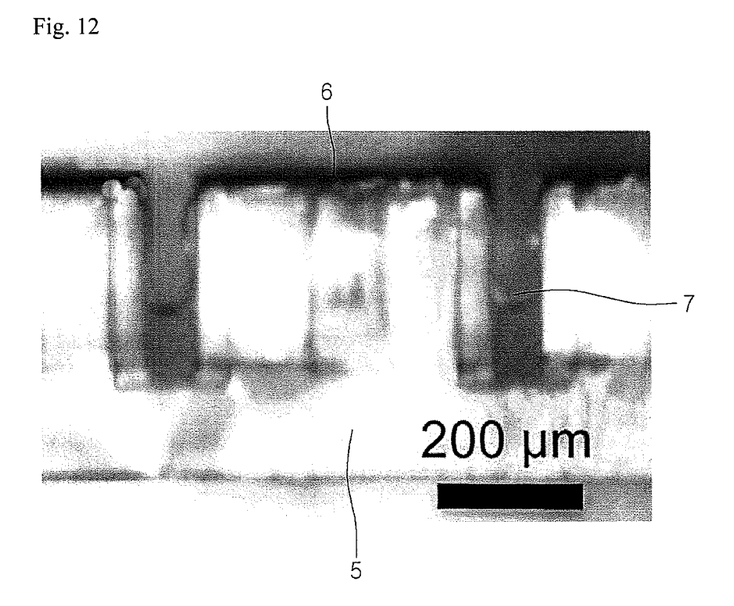

FIG. 9 is a plan view of a photovoltaic apparatus manufactured according to an embodiment, and FIG. 10 is a side view of the stretchable photovoltaic apparatus. FIGS. 11 and 12 are plan and side microscopic images of a stretchable photovoltaic apparatus completed as a real product. Referring to FIGS. 9 to 12, a micro device 6 may be a dual junction GaInP/GaAs cell which is notch-processed similarly to the island 1 and is mounted on the island 1 of a stretchable substrate 5. The area range where the micro devices are mounted is 67% in an unstretched state.

Figure 13:
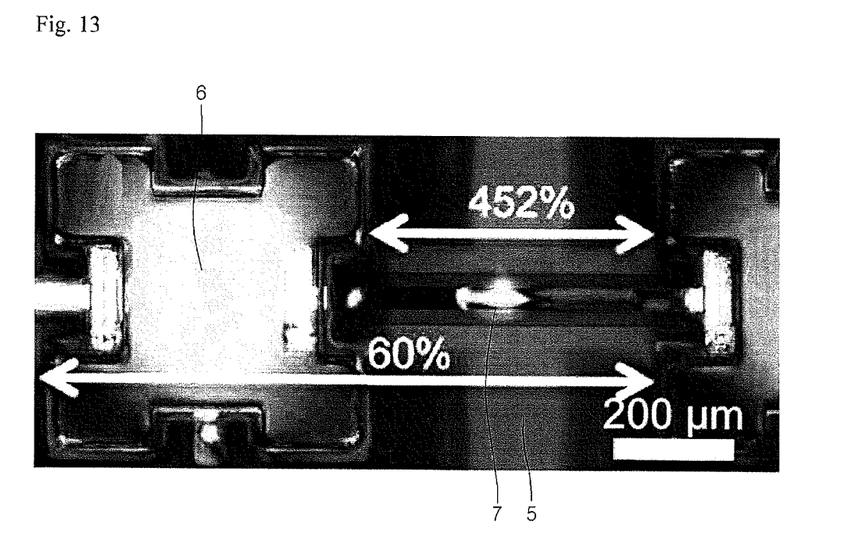
FIG. 13 is a microscopic image of the stretchable photovoltaic apparatus when the stretchable apparatus is stretched by 60% in a biaxial direction.

FIG. 13 is a microscopic image of the stretchable photovoltaic apparatus when the stretchable apparatus is stretched by 60% in a biaxial direction. Referring to FIG. 13, the arc-shaped interconnector 7 may be disposed in the trench 2 to receive a strain up to 452%, and then may be smoothed flat.

Figure 14:
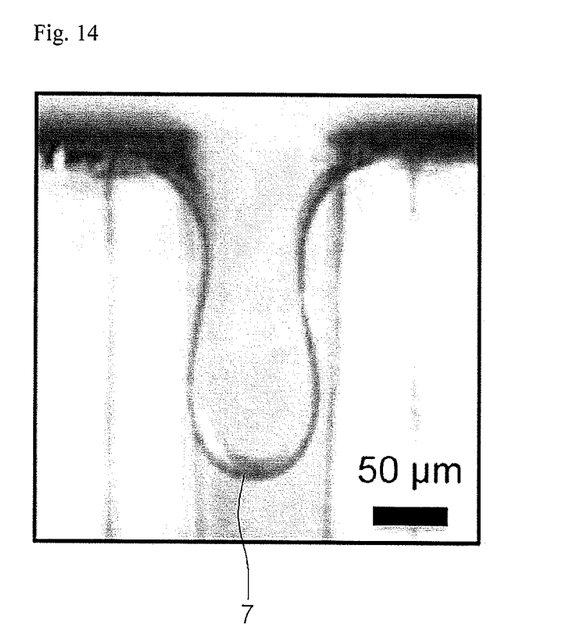
FIG. 14 is a microscopic image when an interconnector is buckled.

FIG. 14 is a microscopic image when an interconnector is buckled.

The performance of the stretchable photovoltaic apparatus (not having an anti-reflection (AR) coating) according to the embodiment was measured by using an automated spectroradiometric measurement system (OL 750 Optronic Lab.) and a solar simulator (Oriel, 91192).

Figure 15:
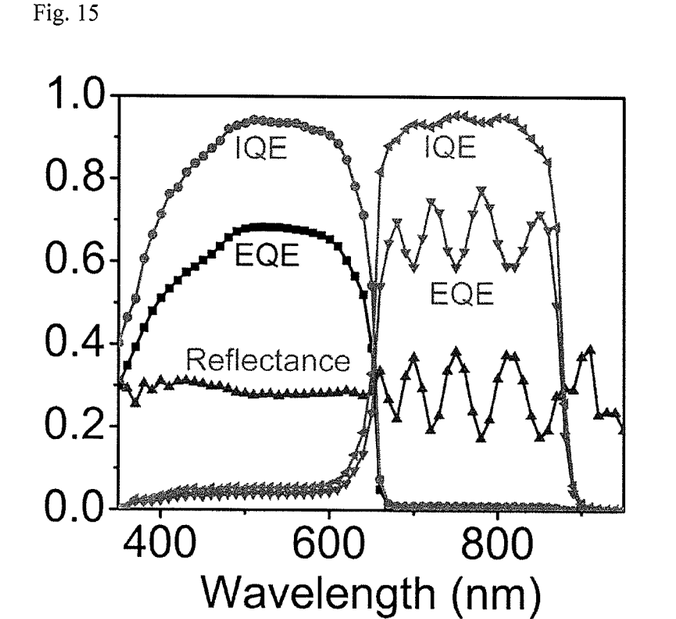
FIG. 15 is a graph showing external quantum efficiency (EQE), internal quantum efficiency (IQE), and reflectance of a stretchable photovoltaic apparatus according to an embodiment.

FIG. 15 is a graph showing external quantum efficiency (EQE), internal quantum efficiency (IQE), and reflectance of a stretchable photovoltaic apparatus according to an embodiment. Referring to FIG. 15, the EQE and the reflectance in both of GaInP layer and GaAs layer are 68% and 28%, respectively. The IQE in both of GaInP layer and GaAs layer is up to 95%.

Figure 16:
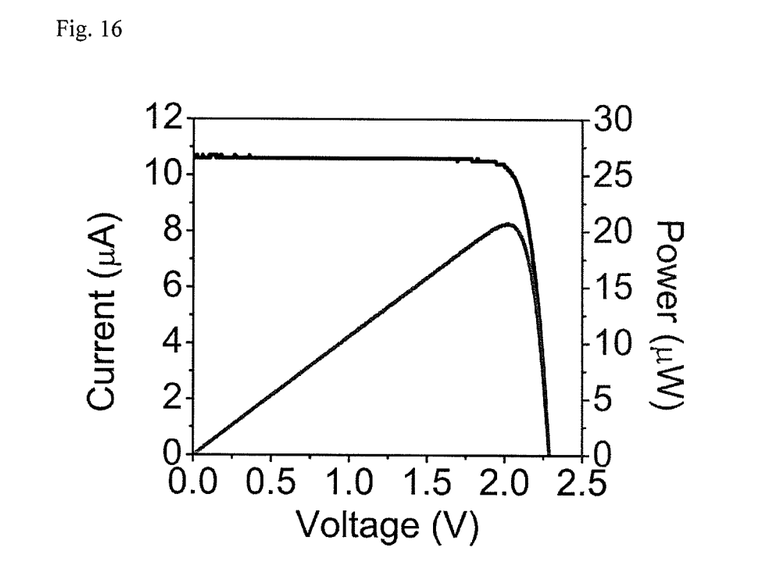
FIG. 16 is a graph showing I-V characteristics of a stretchable photovoltaic apparatus according to an embodiment.

FIG. 16 is a graph showing I-V characteristics of a stretchable photovoltaic apparatus according to an embodiment. Referring to FIG. 16, a short-circuit current is 9.8 μA and an open circuit voltage is 2.28 V. Energy conversion efficiency and fill factor are 19% and 0.85, respectively.

Since the reflectance is up to 28% of incident light, the energy conversion efficiency may be improved up to 25% in a proper AR coating. It is confirmed that the stretchable photovoltaic apparatus provided with micro devices driven by a 2 J solar cell according to the embodiment exhibits improved stretchable characteristics and considerably high conservation efficiency, compared with the notch-free single junction structure (non-patent document 1).

In this regard, the electrical characteristics of EQE and IQE were measured by exposing the micro devices as photovoltaic cells to a short wavelength and using the automated spectroradiometric measurement system. I-V data of the photovoltaic cells were measured by a 1,000 W full spectrum solar simulator using a DC source meter.

Experimental Examples and Conditions

A photovoltaic apparatus according to an embodiment was manufactured by the following method.

—Preparation of PDMS—

A prepolymer is casted and cured with respect to SU8 defined on a silicon wafer by a photolithography to form a silicon elastomer (mixture of a base and a curing agent in a mixing ratio of 10:1, sylgard 184, Dow corning), i.e., a structured PDMS substrate. The cured PDMS is separated to form a structured substrate having a rectangular notch (120 μm×120 μm) in each of four sidewalls.

Islands including the notches and each having a size of 500 μm×500 μm are separated from each other by a recessed trench having a width of 76 μm and a depth of 350 μm.

The base has a thickness of 160 μm. The islands may be precisely shaped by weighting the amount of the prepolymer applied to the patterned SU8.

—Manufacturing of Solar Microcell—

To manufacture a dual junction GaInP/GaAs solar microcell, a GaInP layer and a GaAs layer epitaxially stacked on a GaAs wafer is chemically wet-etched. The wet etching is performed by using HCl (37%, Fisher Scientific) and H3PO4 (855, Fisher Scientific).

A titanium (Ti) film (20 nanometers) and a gold (Au) film (60 nanometers) are sequentially deposited on an n-region and a p-region of the microcell by an electron beam deposition to form an ohmic contact. The microcell is fully coated with a positive photoresist (PR) by using a spin-cast method. A hole is defined around the microcell such that a sacrificial layer under the positive PR is exposed. The sacrificial layer is removed by a chemical etching. At this time, the positive PR protects the microcell from an unwanted etching.

—Electronic Printing and Interconnector—

In the transfer printing of a PDMS stamp, the microcell is first transferred on an epoxy layer. The epoxy layer is spin-casted on a PMMA film on a carrier wafer. The dual layer consisting of the patterned Ti layer and Au layer on an SU8 film having openings in the n-region and p-region provides a serial interconnector between the microcells. Another SU8 layer is spin-casted to position the Ti/Au layer around a neutral mechanical plane.

The SU8 layer is patterned by a reactive ion etching using a patterned SiO2 mask to form an open mesh structure in the islands and a bridge on the carrier wafer.

Another transfer printing is a process of dissolving the PMMA layer in acetone and lifting the interconnected mesh of the GaInP/GaAs solar microcell. A Ti layer and a SiO2 layer are deposited on a rear surface of the mesh to prepare a system. The system indicates that a strain is given in advance and a bonding is performed on the structured substrate. For the required surface chemistry, ultraviolet ozone process is performed so as to generate —OH group.

The remaining detailed conditions that are not suggested in the above experimental examples may be found from the inventor's paper cited in the above description.

<Stretchable Device>

The stretchable photovoltaic apparatus may be applied to other application fields. This is because the semiconductor filed has wide applications. Examples of the stretchable device may include an LED display/lighting system, an integrated circuit system, and a digital observation equipment. In this regard, by mounting the micro device used for operation of a targeted stretchable device instead of the photovoltaic cell of the stretchable photovoltaic apparatus, the object may be sufficiently achieved.

Meanwhile, in order to mount the stretchable device on a separate product, an embodiment in which the stretchable device is integrated may be further included.

Figure 17:
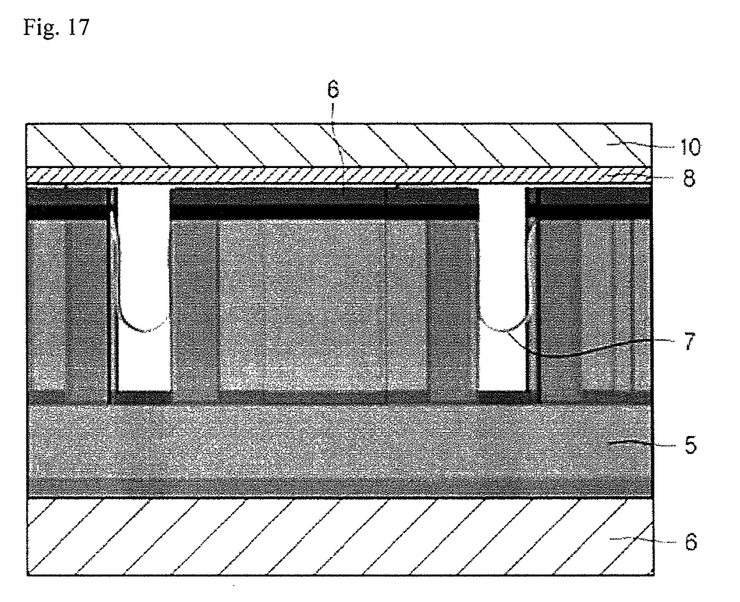
FIG. 17 is a schematic view showing another embodiment of a stretchable device.

FIG. 17 is a schematic view showing another embodiment of a stretchable device.

Referring to FIG. 17, a stretchable device includes a stretchable substrate 5, a micro device 6, an interconnector 7, and a protection coating 8 protecting the micro device 6. In addition, the stretchable device may further include a first stretchable material 9 under the stretchable substrate 5, and a second stretchable material 10 on the protection coating 8.

The first and second stretchable materials 9 and 10 may be a cloth. Alternatively, the second stretchable material 10 may be omitted.

A feature which is not specifically described in the present embodiment may refer to the description of the stretchable photovoltaic apparatus.

According to the present invention, a semiconductor device may be configured in the form of a stretchable array. Therefore, the present invention is expected to be applied to various industrial fields such as a solar cell field, a display field, a semiconductor device field, a medical field, a clothing field, a measurement field, and a filming field. This is because the present invention capable of industrially realizing the stretchable characteristics contributes to such various applications.

According to the present invention, a stretchable behavior of the substrate may be stabilized, micro devices may be stably positioned, a stable operation of the micro device array may be obtained to enhance the reliability of the stretchable product and extend the life span. In particular, diversity in mechanical design that may realize a thick and brittle semiconductor device in a stretchable array may be secure.

What is claimed is:

1. A stretchable photovoltaic apparatus comprising:
   a stretchable substrate including islands protruded from a base such that the islands are separated by a trench, and a notch formed in an edge of each of the islands, wherein the trench isolates neighboring islands;
   a photovoltaic cell mounted on the stretchable substrate; and
   an interconnector of which at least a portion is positioned inside a pair of adjacent notches facing each other, the interconnector electrically connecting neighboring photovoltaic cells in one pair;
   wherein the interconnector spans the trench to bridge the neighboring photovoltaic cells.

2. The stretchable photovoltaic apparatus of claim 1, wherein the island has at least any one shape of a triangle, a rectangle, a polygon, a circle, and an ellipse.

3. The stretchable photovoltaic apparatus of claim 1, wherein the notch has at least any one shape of a triangle, a rectangle, a polygon, a circle, and an ellipse.

4. The stretchable photovoltaic apparatus of claim 1, wherein the notch is provided to a center of the edge of each of the islands.

5. The stretchable photovoltaic apparatus of claim 1, wherein the interconnector is placed inside the notch when the stretchable substrate is deformed and thus the islands in one pair contact each other.

6. The stretchable photovoltaic apparatus of claim 1, wherein each of a plurality of notches is provided to each of edges in one pair facing each other when the island has a rectangular shape.

7. The stretchable photovoltaic apparatus of claim 1, wherein each of a plurality of notches is provided to each of edges of the each of the islands.

8. The stretchable photovoltaic apparatus of claim 1, wherein the photovoltaic cell is a dual junction GaInP/GaAs, a single junction GaAs, a triple junction GaInP/GaAs/Ge, an organic solar cell, a thin film solar cell, or a silicon solar cell.

9. The stretchable photovoltaic apparatus of claim 1, wherein the notch extends from an upper side of the island to an upper side of the base.

10. The stretchable photovoltaic apparatus of claim 1, wherein the photovoltaic cell has a notch having a similar shape to the notch.

11. A stretchable substrate comprising:
    a base;
    islands protruded from the base and spaced apart by a trench from each other; a notch provided to an edge of each of each of the islands; and
    an interconnector of which at least a portion is positioned inside a pair of adjacent notches facing each other, the interconnector electrically connecting neighboring photovoltaic cells;
    wherein the interconnector spans the trench to bridge the neighboring photovoltaic cells.

12. The stretchable substrate of claim 11, wherein the island or the notch has at least any one shape of a triangle, a rectangle, a polygon, a circle, and an ellipse.

13. The stretchable substrate of claim 11, wherein when the island is a polygon, the notch is provided to each of the edges of the islands or the edges in one pair facing each other.

14. The stretchable substrate of claim 11, wherein the notch extends downward from an upper side of the island to the base.

* * * * *